US007718942B2

(12) United States Patent
Lim et al.

(10) Patent No.: US 7,718,942 B2
(45) Date of Patent: May 18, 2010

(54) ILLUMINATION AND COLOR MANAGEMENT SYSTEM

(75) Inventors: Kevin Len Li Lim, Perak (MY); George Panotopoulos, Santa Clara, CA (US); Joon Chok Lee, Sarawak (MY); Yoke Peng Boay, Penang (MY); Selvan Manlam, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 27 days.

(21) Appl. No.: 11/869,077

(22) Filed: Oct. 9, 2007

(65) Prior Publication Data

US 2009/0090843 A1 Apr. 9, 2009

(51) Int. Cl.
*G01J 1/32* (2006.01)
*H05B 37/00* (2006.01)
*H01L 31/12* (2006.01)

(52) U.S. Cl. .......................... 250/205; 315/324; 257/82

(58) Field of Classification Search .............. 250/201.1, 250/205, 226, 208.1, 214.1, 214 C, 214 AL, 250/231.13–231.18, 559.29, 204, 552, 553, 250/578.1; 362/234, 227, 276, 253; 315/307, 315/308, 224, 118, 312, 324; 356/616, 617; 33/1 PT, 1 N; 257/82, 88, 89
See application file for complete search history.

(56) References Cited

U.S. PATENT DOCUMENTS 5,216,245 A * 6/1993 Keegan et al. ......... 250/227.23
6,441,558 B1 * 8/2002 Muthu et al. ................ 315/149
6,630,801 B2 10/2003 Schuurmans
7,045,974 B2 * 5/2006 Lin et al. .................... 315/308
7,119,500 B2 10/2006 Young
7,140,752 B2 11/2006 Ashdown
7,230,222 B2 6/2007 Cheng et al.
7,319,298 B2 * 1/2008 Jungwirth et al. ........... 315/307
7,339,332 B2 * 3/2008 Cull et al. ................... 315/291
2002/0130260 A1 * 9/2002 McCord et al. ............. 250/306
2005/0133686 A1 6/2005 Ng et al.

OTHER PUBLICATIONS

U.S. Appl. No. 11/565,540, filed Nov. 30, 2006 entitled Light Sourch Having More Than Three LED'S in Which the Color Points Are Maintained Using a Three Channel Color Sensor by Selvan et al.

* cited by examiner

*Primary Examiner*—Georgia Y Epps
*Assistant Examiner*—Don Williams

(57) ABSTRACT

Systems and methods for illumination and color management in a system having a plurality of color sources and a plurality of color sensors, wherein there are more color sources than color sensors are described herein. An embodiment of the method includes emitting a plurality of different colors of light from at least two of the color sources, wherein the plurality of colors consist of different intensities of light emitted by the plurality of color sources. Colors of light emitted by the at least two color sources are detected using at least one of the color sensors. The color rendering index for each of the plurality of colors emitted is determined. A color of light to be emitted by the light sources is selected. The intensities of light to be emitted by the color sources is selected, based at least in part on the color rendering index, to achieve the selected color of light.

25 Claims, 2 Drawing Sheets

ILLUMINATION AND COLOR MANAGEMENT SYSTEM

This application is related to application Ser. No. 11/565,540, entitled LIGHT SOURCE HAVING MORE THAN THREE LEDs IN WHICH THE COLOR POINTS ARE MAINTAINED USING A THREE CHANNEL COLOR SENSOR, filed on Nov. 30, 2006, which is hereby incorporated by reference for all that is disclosed therein.

BACKGROUND

In order to generate a wide spectrum of colors using an illumination system, a few different colors are mixed or combined in different ratios. The different colors are monitored and, based on their intensity, are modified to achieve a desired color or chromaticity. This system is referred to herein as an illumination and color management (ICM) system. The ICM system serves to maintain a desired color point stable.

A typical illumination system uses three primary colors, such as red, green, and blue to generate desired colors. Three sensors are used to monitor the three primary colors in order to assure that the desired color is generated. In an illumination system, additional parameters can to be monitored in order to achieve better colors. Monitoring these parameters and performing corrections based on the parameters yields better results when more color sources are used to generate the desired color. However, when more color sources are used, more sensors are required to monitor the color sources, which increases the complexity and cost of the illumination system.

DESCRIPTION

Figure 1:
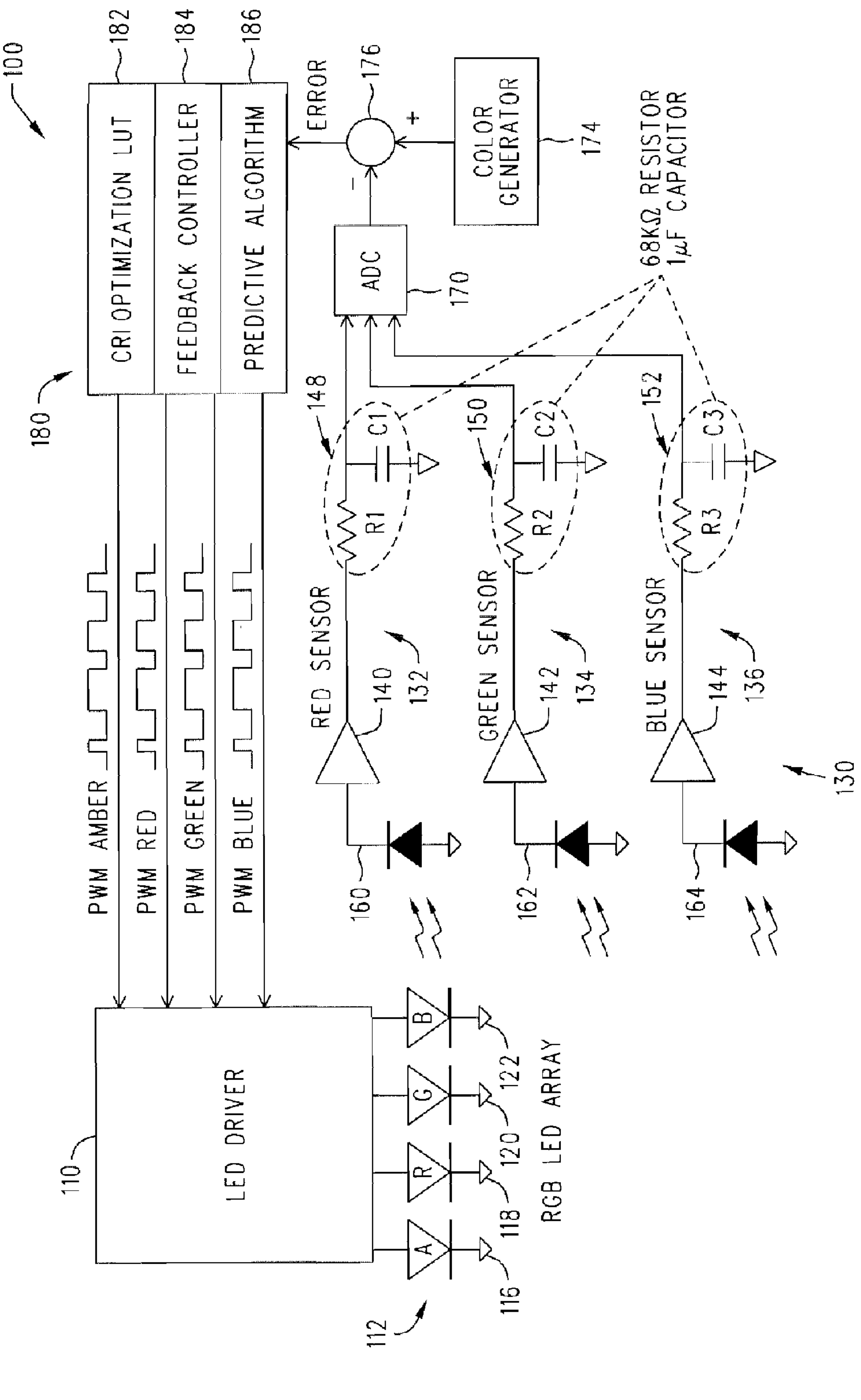
FIG. 1 is a schematic diagram of an embodiment of an illumination and color management system.

An embodiment of an illumination and color management (ICM) system 100 is schematically shown in FIG. 1. The ICM system 100 includes an LED driver 110 that drives a plurality of LEDs 112. In the embodiment of the ICM system 100 described herein, the LED driver 110 drives four colors of LEDs 112. The four colors of LEDs 112 are referred to individually as an amber LED 116, a red LED 118, a green LED 120, and a Blue LED 122. It is noted that the LED driver 110 is shown driving different colored LEDs, however, the LED driver 110 may drive a plurality of LEDs having the same color. It is also noted that colors other than amber, red, green, and blue may be used with the ICM system 100. While the system described herein emits light using LEDs 112, it is to be understood that light emission via means other than LEDs may be used. Therefore, the term LED may refer to light sources other than light emitting diodes.

The ICM system 100 includes a plurality of color sensors 130 that monitor certain colors of light emitted by the LEDs 112. In the embodiment of the ICM system 100 described herein, three color sensors 130 are used and are referred to individually as a red sensor 132, a green sensor 134, and a blue sensor 136. Systems and methods are described herein that enable color point control and control of other parameters using fewer sensors than colors of LEDs or colors of other light emitters. The color point control described herein enables the color rendering index to be maximized.

Each of the color sensors 130 includes an amplifier, a detector, and a low pass RC filter or sample circuit, which are sometimes referred to as filters. The amplifiers are referred to individually as reference numerals 140,142, and 144 for the red amplifier, the green amplifier, and the blue amplifier, respectively. In the embodiment described herein, the filters are resistor-capacitor networks, and are referred to individually as the red filter 148, the green filter 150, and the blue filter 152. The resistors are referred to individually as R1, R2, and R3 and the capacitors are referred to individually as C1, C2, and C3. In one embodiment, the resistors R1, R2, and R3 have values of approximately 68 k ohms and the capacitors C1, C2, and C3 have values of approximately 1.0 μF.

The color sensors 130 may include LED detectors with filters located thereon so as to receive certain bandwidths of light. The red sensor 132 has a detector 160 that is adapted to receive a bandwidth of light centered around red light. The green sensor 134 has a detector 162 that is adapted to receive a bandwidth of light centered around green light. The blue sensor 136 has a detector 164 that is adapted to receive a bandwidth of light centered around blue light. The sensors detect a spectrum of light and the spectrum of light will be referred to as a single color herein. For example, when the red sensor 132 detects or senses red light, it is to be understood that a spectrum of light centered or including red is detected or sensed. It is noted that colors may overlap. Thus, the red sensor 132 may detect light having blue or green components. The intensity of light received by individual sensors 130 is proportional to a voltage output by the respective sensors 130.

The outputs of the color sensors 130 are connected to the input of an analog to digital converter (ADC) 170. The ADC 170 outputs a digital representation of the colors sensed by the sensors 130. In one embodiment, the ADC 170 converts the output of a single sensor to a binary number and repeats this process periodically for the different sensors 130. For example, the ADC 170 may output a binary number representative of the intensity of the sensed red light. Subsequently, the ADC 170 may output a binary number representative of the sensed green light. This process may continue during operation of the ICM system 100.

A color generator 174 generates binary numbers or the like that are representative of the colors that are supposed to be sensed by the color sensors 130. For example, if the LED driver 110 is instructed to output a specific color having specific color components, these color components are measured by the color sensors 130 and binary or digital representations of the colors are output by the ADC 170.

The outputs from the ADC 170 and the color generator 174 are compared by a comparator 176. An error signal is output by the comparator 176, wherein the error signal is representative of the difference between the output of the ADC 170 and the color generator 174. Thus, if the magnitude of the error signal exceeds a predefined threshold, the difference between the color emitted by the combination of LEDs 112 and the color that was supposed to be emitted is great. Likewise, if the magnitude of the error signal below a predefined threshold, then the difference between the color emitted by the combination of LEDs 112 and the color that was supposed to be emitted is minimal.

The feed back of the ICM 100 described above can be explained with the following example of a system using three LEDs and three detectors. In these embodiments, there is a strict 1:1 map between color output by the LEDs 112 and voltages output by the color sensors 130. In this example, the color of 4000 degrees Kelvin is desired to be output. There is a CIE x,y coordinate that maps to this specific color temperature and may be represented by 1.2 volts, 1.1 volts and 0.4 volts from the red, green, and blue sensor outputs respectively. No other voltage set can map to this color temperature. The sensors 130 detect the combined color from the LEDs 112. If that detected color combination is not 4000 degrees Kelvin, the outputs of the sensors 130 will be in error compared to the 1.2, 1.1 and 0.4 volts described above. This generates a set of three error signals, one for red, one for green, and one for blue. A feedback system such as a PID system can be used to minimize the error by manipulating the three pulse width modulation (PWM) signals input to the LED driver 110. The LED driver 110, in turn, manipulates the intensity of each primary color output (red, green, blue) of the LEDs 112. This process continues until the voltages output by the color sensors 130 and the color generator 174 are the same.

As briefly described above, the error signal provides feed back for a controller 180 that sends control signals to the LED driver 110. The embodiment of the controller 180 described herein uses four colors and three sensors and includes a color rendering index (CRI) optimization look up table 182, and a feedback controller 184. The controller 180 serves to control the intensity of the different colors of LEDs 112 in order to have the LEDs 112 produce the correct color, while maximizing the color rendering index. In the embodiment provided herein, the intensities of the LEDs 112 are varied by varying the duty cycle of pulse width modulation (PWM) signals transmitted to the LED driver 110.

In operation, the controller 180 transmits signals to the LED driver 110 indicating the intensities of the outputs of the LEDs 112. As stated above, the intensities may be controlled using the duty cycle of pulse width modulated signals. The LED driver 110 causes the LEDs 112 to emit light based on the signals from the controller 180.

The three color detectors 156 monitor the intensities of the red, green, and blue spectral components of the light emitted by the LEDs 112. Using the red sensor 132 as an example, the detector 160 receives red light and outputs a voltage proportional to the intensity of red light. The voltage is amplified by the amplifier 140 and is held for a short period by the filter 148, which allows the voltage to be sampled by the ADC 170. The same process applies to the green sensor 134 and the blue sensor 136. It is noted that the light incident on the sensors 130 is pulsing due to the pulse width modulation signals driving the LEDs 112. Therefore, the outputs from the sensors 130 are pulsing; the purpose of the RC filters is to provide a time average signal to the ADC 170.

The ADC 170 outputs signals are representative of the emitted colors to the comparator 176. The color generator 174 outputs a signal representative of the desired colors to the comparator 176. An error signal is generated by the comparator 176 based on the differences between the signals from the ADC 170 and the color generator 174. This error signal is transmitted to the generator 180, which modifies the signals to the LED driver 110 in order to have the LEDs 112 emit the correct colors or the correct intensities that combine for the correct color.

Having described the ICM system 100, its operation will now be described. More specifically, the use of three sensors to determine colors using four emitters will be described. It is noted that the following description is for exemplary purposes and that other numbers of sensors and emitters may be used in other embodiments. However, the methods described herein apply to ICM systems wherein there are more emitters than sensors. The following methods described herein may be performed using computer code in a computer readable medium, such as magnetic storage, optical storage, firmware, or other hardware devices.

In summary, synthetic sources are created and sampled during a calibration phase. The synthetic sources are combinations of the actual sources. For example, one synthetic source may be a combination of the green LED 120 and the blue LED 122. It is noted that several synthetic sources may be used herein. Analysis of the combinations are stored in the look up table 182 and are compared to various operating parameters. A specific combination is used based on specific operating parameters.

Figure 2:
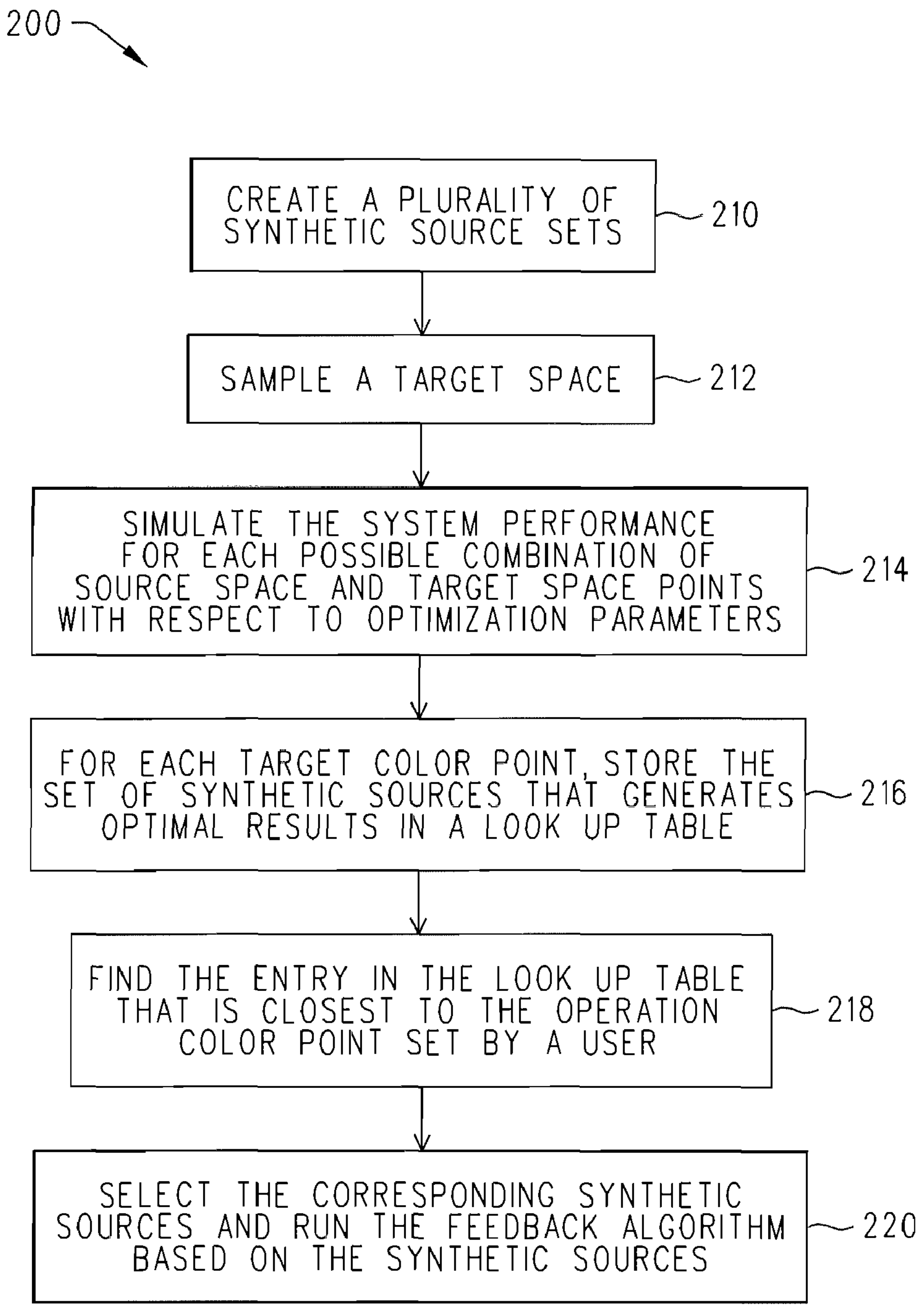
FIG. 2 is a flowchart of an embodiment of using fewer detectors than light sources to set at least one optical parameter.

An example of the above-described method is provided in FIG. 2, which is a flowchart 200 of an embodiment of using fewer detectors than light sources to set at least one optical parameter in the ICM system of FIG. 1. In step 210, a plurality of synthetic source sets are created. Synthetic sources are combinations of light emitters or LEDs 112. In the embodiment of the ICM system 100 of FIG. 1, there are four sources, the amber LED 116, the red LED 118, the green LED 120, and the blue LED 122, and three color sensors 130. Therefore, two sources need to be combined in order to yield three sources, the combined sources constitute a synthetic source. The synthetic source space may have the following six combinations: blue-green, blue-amber, blue-red, green-amber, green-red, and amber-red. The combinations can have varying intensities of their constituent sources, which constitute a plurality of different synthetic sources. For example, each combination may have nine different intensities, wherein the intensities are based on ten percent increment steps, which yields the nine different intensities. Accordingly, each combination has a possibility of nine synthetic sources. Because there are six combinations, there are fifty-four sample points for the synthetic source space.

With regard to the above-described example, there are six combinations: blue/green, blue/amber, blue/red, green/amber, green/red, and amber/red, and each combination has nine different intensities. Using the blue/green combination as an example, there are nine different intensities of: blue 10% and green 90%; blue 20% and green 80%; blue 30% and green 70%, etcetera. Therefore, there are 54 synthetic source sets. It is noted that increments other than ten percent may be used, which may yield more or less than 54 synthetic sources.

In step 212 the target space is sampled. In the example described herein, the possible target color points are the chromaticity coordinates of Black Body sources with color temperatures of 2500K, 4000K, 6500K, and 9300K. In other embodiments, other color temperatures may be used. It is noted that the target space denotes different desired colors.

At step 214, the ICM system 100 is simulated for each of the fifty-four sets of synthetic sources with respect to the four target color points. This yields 216 simulations; 54 synthetic source sets with four color temperatures. For example, each synthetic source is used with the actual sources to achieve the target color temperatures. In an example of a red/green synthetic source, each of the nine combinations of red/green is used with blue and amber to achieve the different color temperatures.

At step 216, the synthetic sources that generate optimal results for each target color point are stored in the look up table 182 or the like. In the example provided herein, the results with optimal color rendering index (CRI) are stored in the look up table 182. However, parameters other than CRI may be used as criteria for storing the synthetic source combinations that generate optimal results.

In one example, synthetic source combinations that yield optimal CRI are stored. The optimal CRI may be as follows for each target color point, which constitutes the target look up table:

| Target color point | Synthetic source with optimal CRI |
|---|---|
| 2500K | B-50% A-50% |
| 4000K | B-30% R-40% |
| 6500K | G-10% A-90% |
| 9300K | A-40% R-60% |

During use, a user selects a target color point, or a desired color, by selecting a color temperature. At step 218, the ICM system 100 selects the color temperature stored in the look up table 182 that is closest to the target color point. In step 220, the synthetic source values of the selected color temperature from step 218 from the lookup table are used in the feed back of the ICM system 100 to maintain consistent colors with optimal CRI or other parameter.

With regard to the above-described example, a user sends a target color point to the ICM 100. For example, the user may send a color temperature of 9000K. The ICM 100 will select the closest color temperature to the target color point from the look up table 182. In this example, the closest color temperature/color point is 9300K. Because 9300K is the closest color temperature, the system will use the synthetic source of Amber 40% and red 60% for the ICM 100 to maintain consistent color. As noted above, this ratio has the optimal CRI from step 214.

The ICM 100 has been described herein as using a combination of two light sources to generate one synthetic source. However, several light sources may be combined to generate several synthetic sources. For example, in a situation of five light sources and three detectors, two pairs of light sources may be combined to generate two synthetic sources. Likewise, three sources may be combined to make a single synthetic source.

Having described portions of the operation of the ICM system 100, calibration of the ICM system 100 will now be described.

Conventional ICM systems require the user to acquire the responses of the sensors to each source (S matrix) and the chromaticity coordinates of each source (C matrix). The ICM system 100 described herein may be calibrated using several different methods as described below.

In the first method, the user collects spectral information of each source or LEDs 112. The above-described lookup table uses the spectra collected from the LEDs 112. This method provides very accurate calibration. However, this procedure must be done for each ICM system 100.

In a second method, a user obtains the spectral information for each lot or bin of LEDs 112 or other light sources. More specifically, a vendor of light sources may obtain the spectral information of a lot or bin of sources. This spectral information may then be used by the ICM system 100. The disadvantage is that the individual light sources may emit spectrums that are slightly different from the lot or bin information. The advantage is that the ICM system 100 does not need to be calibrated by measuring the spectra of each of the LEDs 112 that are from the same lot or bin.

The third method requires a user to perform a one time calibration using a typical set of RGBA LEDs. The look up table generated by this one set of RGBA LEDs will represent all other sets of RGBA LEDs used in the production. Alternatively, a user can send RGBA LEDs spectral information to a manufacturer, which will generate a look up table based on that the LED spectral information. In a similar embodiment pre-generated look up tables that are stored within the ICM system 100 can be used based on standard RGBA LEDs spectral information provided by LEDs suppliers. The spectral information is retrieved and used in the feed back system of the ICM system 100. This calibration method is the least costly. However, this calibration method is also the least precise in that the spectral information of the LEDs 112 or light sources is not precisely known.

The fourth method involves measuring the spectral information for each of the LEDs 112 in addition to the corresponding XYZ tristimulus values. This information is used to generate a matrix that can be multiplied by a user specified target color point to yield the drive level of each of the LEDs 112. The matrix will serve to maximize the CRI of the LEDs 112 in addition to controlling their color points. In this embodiment, the CRI of the LEDs 112 is inversely proportional to the difference in color of surfaces rendered by a test light source to those rendered by a reference light source of similar correlated color temperature (CCT). Thus, minimizing the spectral difference between the test and the reference light sources will maximize the CRI, while maintaining the desired color point. This process involves minimizing:

$$\frac{1}{2}\|Ax - b(d)\|$$

subject to $Cx-d=0$ and wherein:

- A is the LED spectra at maximum drive in the matrix column;
- C is the corresponding XYZ tristimulus values in matrix columns;
- d is the XYZ tristimulus value of the desired color point as a column vector; and
- x is the LED drive levels from zero to one as a column vector.

In practice, each of the LEDs 112 is driven at their maximum and their spectra are measured. The measuring of the spectra are performed at predetermined intervals, such as 1.0 nm intervals and stored as the columns of matrix A. The equation is solved giving x in terms of a matrix equation as a function of d.

When computing CRI, different function for b apply to CCTs above and below 5000K. However, using only the b function for CCTs above 5000K may be suitable even at low CCTs. It is noted that the CRI may only be meaningful for colors close to the black body locus. Therefore, b may be a legitimate argument for the function d.

What is claimed is:

1. A method for illumination and color management in a system having a plurality of color sources and a plurality of color sensors, wherein each color source emits a discreet color of light and wherein there are more color sources than color sensors, said method comprising:

emitting a plurality of colors of light using at least two of said color sources, wherein said plurality of colors consist of different intensities of light emitted by said plurality of color sources detecting colors emitted by said at least two color sources using at least one of said color sensors;

determining a parameter for each of said plurality of colors emitted;

selecting a color of light to be emitted by said light sources; and choosing the intensities of light to be emitted by said color sources, based at least in part on said parameter, to achieve the selected color of light.

2. The method of claim 1, wherein said emitting comprises emitting light from two of said color sources.

3. The method of claim 1, said detecting comprises detecting light using a plurality of said color sensors.

4. The method of claim 1, wherein said emitting comprises emitting a first color of light and a second color of light from two of said color sources, wherein the intensities of light emitted by said two color sources varies between said first color of light and said second color of light.

5. The method of claim 1, wherein said emitting comprises emitting light to achieve at least one color temperature.

6. The method of claim 1, wherein said emitting comprises emitting a plurality of colors from two of said color sources, wherein the ratios of colors emitted by said two color sources and said color temperatures emitted by said two color sources varies.

7. The method of claim 1, and further comprising calibrating said illumination and color management system, said calibrating comprising:

measuring the spectral information of each of said color sources and the corresponding XYZ tristimulus values;

generating a matrix based on said measuring; and minimizing $$\frac{1}{2}\|Ax - b(d)\|$$

subject to: Cx−d=0 wherein:

A is the LED spectra at maximum drive in the matrix column

C is the corresponding XYZ tristimulus values in matrix columns d is the XYZ tristimulus value of the desired color-point as a column vector; and x is the LED drive levels from zero to one as a column vector.

8. The method of claim 1, wherein said parameter is color rendering index.

9. The method of claim 8, wherein said choosing comprises choosing the intensities of light to be emitted by said color sources that provide the maximum color rendering index.

10. A method for illumination and color management in a system having a plurality of color sources and plurality of color sensors, wherein each color source emits a discreet color of light and wherein there is one more color source than color sensors, said method comprising:

emitting a plurality of colors using a combination of two of said color sources, wherein said plurality of colors consist of different intensities of light emitted by the two color sources;

detecting said plurality of colors emitted by said color sources using at least one of said color sensors determining] a parameter for each of said plurality of colors emitted;

selecting a color of light to be emitted by said light sources; and choosing the intensities of light to be emitted by said color sources based on said selecting and said determining.

11. The method of claim 10, wherein said emitting comprises emitting light with varying intensities.

12. The method of claim 10, wherein said emitting comprises emitting light having different intensities, said different intensities varying at ten percent increments.

13. The method of claim 10, wherein said emitting comprises emitting light to achieve at least one color temperature.

14. The method of claim 10, wherein said emitting comprises emitting light from two of said color emitters, wherein the intensities of light and color temperature emitted by said two color emitters varies.

15. The method of claim 10, and further comprising calibrating said illumination and color management system, said calibrating comprising:

measuring the spectral information of each of said color emitters and the corresponding XYZ tristimulus values;

generating a matrix based on said measuring; and minimizing $$\frac{1}{2}\|Ax - b(d)\|$$

subject to Cx−d=0 wherein:

A is the LED spectra at maximum drive in the matrix column;

C is the corresponding XYZ tristimulus values in matrix columns;

d is the XYZ tristimulus value of the desired color-point as a column vector; and x is the LED drive levels from zero to one as a column vector.

16. The method of claim 10, wherein said parameter is color rendering index.

17. The method of claim 16, wherein said choosing comprises choosing the intensities of light to be emitted by said color sources that provide the maximum color rendering index.

18. A method of calibrating an illumination system, said illumination system comprising a plurality of color emitters and color sensors, said method comprising:

measuring the spectral information of each of said color emitters and the corresponding XYZ tristimulus values;

generating a matrix based on said measuring; and minimizing $$\frac{1}{2}\|Ax - b(d)\|$$

subject to Cx−d=0 wherein:

A is the LED spectra at maximum drive in the matrix column;

C is the corresponding XYZ tristimulus values in matrix columns;

d is the XYZ tristimulus value of the desired color-point as a column vector; and x is the LED drive levels from zero to one as a column vector.

19. An illumination and color management system comprising:

a plurality of color sources, wherein each color source emits a discreet color of light;

at least one fewer color sensors than color sources;

a computer readable medium having code stored thereon for:

enabling a plurality of said color sources to emit different colors of light from at least two of said color sources, wherein said plurality of colors consist of different intensities of light emitted by said plurality of color sources;

enabling at least one color sensor to detect colors emitted by said at least two color sources;

determining a parameter for each of said plurality of colors emitted;

selecting a color of light to be emitted by said light sources based on a user input; and choosing the intensities of light to be emitted by said color sources, based at least in part on said determining, to achieve the selected color of light.

20. The system of claim 19, wherein said enabling a plurality of color sources to emit different colors of light comprises enabling two said color sources to emit different colors of light, wherein said different colors of light consist of different intensities of light emitted by said two color sources.

21. The system of claim 19, wherein said enabling a plurality of color sources to emit different colors of light comprises emitting a first color of light and a second color of light from two of said color emitters, wherein the intensities of light emitted by said two color emitters varies between said first color of light and said second color of light.

22. The system of claim 19, wherein said enabling a plurality of color sources to emit different colors of light comprises emitting light to achieve at least one color temperature.

23. The system of claim 19, wherein said enabling a plurality of color sources to emit different colors of light comprises emitting a plurality of colors from two of said color emitters, wherein the ratios of light and emitted by said two color emitters and said color temperatures emitted by said two color emitters varies.

24. The system of claim 19, wherein said code provide for calibrating said system said calibrating comprising:

measuring the spectral information of each of said color emitters and the corresponding XYZ tristimulus values;

generating a matrix based on said measuring; and minimizing $$\frac{1}{2}\|Ax - b(d)\|$$

subject to Cx−d=0 wherein:

A is the LED spectra at maximum drive in the matrix column;

C is the corresponding XYZ tristimulus values in matrix columns;

d is the XYZ tristimulus value of the desired color-point as a column vector; and x is the LED drive levels from zero to one as a column vector.

25. The system of claim 19, wherein said choosing comprise choosing the intensities of light to be emitted by said color sources that provide the maximum color rendering index.

* * * * *